United States Patent [19]

Appels et al.

[11] 3,900,350

[45] Aug. 19, 1975

[54] METHOD OF MANUFACTURING SEMICONDUCTOR DEVICES IN WHICH SILICON OXIDE REGIONS INSET IN SILICON ARE FORMED BY A MASKING OXIDATION, WHEREIN AN INTERMEDIATE LAYER OF POLYCRYSTALLINE SILICON IS PROVIDED BETWEEN THE SUBSTRATE AND THE OXIDATION MASK

[75] Inventors: Johannes Arnoldus Appels; Wilhelmus Henricus Cornelis Gerardus Verkuijlen, both of Emmasingel, Eindhoven, Netherlands

[73] Assignee: U.S. Philips Corporation, New York, N.Y.

[22] Filed: Apr. 4, 1973

[21] Appl. No.: 347,806

[30] Foreign Application Priority Data

Apr. 8, 1972 Netherlands ........................ 7204741

[52] U.S. Cl. ........................ 148/175; 29/578; 29/580; 29/590; 148/174; 148/187; 357/40; 357/50; 357/59; 357/86; 427/86; 427/94

[51] Int. Cl.$^2$ ........................ H01L 21/76; H01L 27/04; H01L 21/20

[58] Field of Search ........................ 148/174, 175, 187; 117/118, 212, 215; 29/578, 580, 590; 317/235; 427/94, 86

[56] References Cited

UNITED STATES PATENTS

| | | | |
|---|---|---|---|
| 3,719,535 | 3/1973 | Zoroglu | 148/187 |
| 3,755,014 | 8/1973 | Appels et al. | 148/175 X |
| 3,784,847 | 1/1974 | Kurz et al. | 317/235 F X |

OTHER PUBLICATIONS

Morandi, F., "Planox Process Smoothes Path to Greater MOS Density" Electronics, Dec. 20, 1971, pp. 44–48.

Chang et al., "Fabrication for Junction Insulating Gate FET." I.B.M. Tech. Discl. Bull., Vol. 13, No. 9, Feb. 1971, p. 2503.

*Primary Examiner*—L. Dewayne Rutledge
*Assistant Examiner*—W. G. Saba
*Attorney, Agent, or Firm*—Frank R. Trifari; Jack Oisher

[57] ABSTRACT

The manufacture of semiconductor devices, particularly silicon ICs, employing isolating inset oxides is described. To prevent formation of a projecting oxide beak under an oxidation masking layer, a layer of polycrystalline silicon is provided under the oxidation mask instead of the usual silicon oxide.

11 Claims, 11 Drawing Figures

Figure 1:
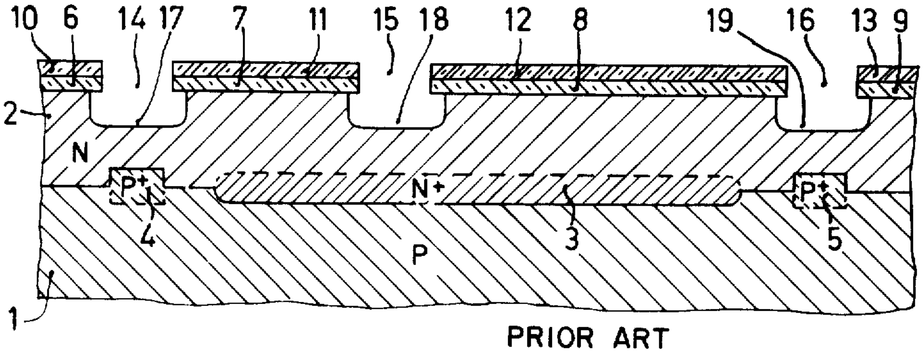
PRIOR ART Fig.1

METHOD OF MANUFACTURING SEMICONDUCTOR DEVICES IN WHICH SILICON OXIDE REGIONS INSET IN SILICON ARE FORMED BY A MASKING OXIDATION, WHEREIN AN INTERMEDIATE LAYER OF POLYCRYSTALLINE SILICON IS PROVIDED BETWEEN THE SUBSTRATE AND THE OXIDATION MASK

The invention relates to a method of manufacturing a semiconductor device, in particular a monolithic integrated circuit, in which in a surface-adjacent part of a semiconductor body consisting at least mainly of monocrystalline silicon, regions of silicon oxide inset in the silicon are formed by oxidation of the silicon with the use of a masking protecting locally against the oxidation, said masking comprising a layer of a material masking against said oxidation.

The invention furthermore relates to semiconductor devices, in particular monolithic integrated circuits, manufactured by using such a method.

Such methods have been described inter alia in "Philips Research Reports" 26 (1971–06), 157 – 165 and 166 – 180. Silicon nitride is generally used as a material masking against the oxidation, but in principle other materials, which preferably are not oxides themselves, might also be considered as materials masking against the oxidation. They should not be oxidised or be oxidised only extremely slowly. Such materials which should be capable of withstanding the temperatures used during the oxidation will in general have to have a dense structure with strong interatomic bonds so as to prevent the diffusion of oxygen. As a result of these strong interatomic bonds, said materials will in general have a high tensile strength. Furthermore, the masking layer should be readily bonded or adhered to the silicon so as to prevent the working loose of the mask from the silicon during the oxidation process as a result of which the parts of the silicon surface to be masked would be exposed. As is known from the first-mentioned article in Phillips Research Reports, 26, pp. 157 – 165, the masking becomes slightly tilted along the edge of the oxidation mask by lateral oxidation below said mask as a result of the increase in volume occurring during the oxidation. As a result of this the danger of stripping of the layer would exist. It is therefore of importance for the adherence of said layer to the substratum to be sufficiently strong. However, due to the tensile strength of the layer of material masking against the oxidation, the underlying monocrystalline silicon may come under a mechanical stress at the oxidation temperature used. As a result of said stresses, shifts in the crystal lattice may occur in said silicon which may be associated with a strong increase of imperfections, such as locally dense concentrations of dislocations. It is possible that the electric properties of semiconductor devices in which such a process has been used, can be influenced by this. When, for example, p-n junctions are manufactured in such disturbed silicon, said junctions may exhibit comparatively high leakage currents. This influence can be unfavorable in particular for a reproducible production of semiconductor devices in which only small tolerances in the electric properties are permitted or in which a number of circuit elements are accommodated. For example, the formation of locally high concentrations of dislocations was already known in forming inset oxide patterns by oxidation with the use of a mask consisting of a layer of silicon nitride which was provided directly on the monocrystalline silicon.

In order to inhibit the above-mentioned disturbing effect of the layer of material masking against oxidation on the crystal structure of the silicon, a thin layer of silicon oxide had already been used between a layer of silicon nitride as a material masking against oxidation and the silicon, in which presumably said thin intermediate layer can neutralize the mechanical stresses between the silicon and the layer of the material masking against oxidation at the heating temperatures used. It has been found, for example, that excessive disturbance of the silicon lattice is prevented in this manner.

It was known, however, that upon using a masking against oxidation consisting of a layer of silicon nitride as a material masking against oxidation and an underlying layer of silicon oxide on the silicon, a lateral spur of silicon oxide which becomes gradually thinner from the edge is formed along the edges of the inset regions of silicon oxide formed by oxidation, which spurs were formed by oxidation of the silicon present below the thin oxide layer. This phenomenon is ascribed to lateral diffusion of oxygen via the thin silicon oxide layer and, due to the shape upon observation of a cross-section, it was sometimes termed "beak-effect". The phenomenon may be annoying in further stages of manufacturing a semiconductor device. For lateral island isolation, a known advantage of the use of regions of insulation material inset in the semiconductor relative to isolation zones consisting entirely of p-n junctions is that, in the latter case, for good insulation between such an isolation zone and an in-diffused zone to obtain p-n junctions in an island, a certain distance should be maintained between the isolation zone and the in-diffused zone, whereas upon using inset insulation material such an in-diffused zone can be bounded without objection by the isolation zone, as a result of which inter alia a considerable space saving can be obtained. The diffused zone may even adjoin the inset layer of insulation material along its whole circumference, as a result of which strongly curved edges of the p-n junction with reduced breakdown voltage are avoided.

However, due to the occurrence of a comparatively wide spur of silicon oxide along the inset oxide pattern becoming gradually thinner, a part of the beak-like spur of siliconoxide may be maintained upon removing the silicon nitride mask and the underlying thin oxide layer, before carrying at the above-mentioned diffusion process, if the etching process for the removal of the thin oxide layer is not continued sufficiently long. Such a remaining part of the spur may have a masking effect upon forming the diffused zone and may possibly even determine the lateral boundary of said zone, in which case the p-n junction of said zone with the remaining region of the originally present material may have curved edges. During the formation of the diffused zone according to planar methods known per se, generally an oxide layer is again formed on the free silicon surface. When this is etched away, the remaining part of the beaklike spur can be further reduced, as a result of which it might even be possible in principle that the p-n junction becomes exposed. In this manner, the advantages of space saving and absence of a strongly curved p-n junction described for the use of inset oxide patterns would be obtained only partially. When in such a diffused zone a further zone of a type opposite to that of the said diffusion is to be provided, difficulties can be obtained when said further zone would be made to adjoin at least partly the inset insulation layer and said zone would for the rest be made to adjoin the above-mentioned diffusion zone entirely so as to obtain, for example, a further space saving for the manufacture of a transistor having very small dimensions. The drawback then exists that the location of the lateral boundaries of the two zones relative to each other is not optimum or sufficiently accurately reproducible. In principle it would even be possible that a short-circuiting connection is formed between the further zone and the regions below the previously formed diffusion zone as will be described in detail hereinafter.

One of the objects of the present invention is to provide a measure with which the above-mentioned difficulties in using maskings against oxidation provided in known manner are avoided.

According to the invention, a method of the type mentioned in the preamble is characterized in that a layer of polycrystalline silicon is provided between the layer of the material masking against the oxidation and the underlying monocrystalline silicon, and that the oxidation is carried out down to a depth larger than the thickness of the layer of polycrystalline silicon. It has been found that the progress of the silicon oxide - silicon interface in polycrystalline silicon is not noticeably different from that in monocrystalline silicon, as a result of which "beak formation" does not occur, while mechanical stresses between silicon nitride and silicon do not result in the occurrence of excessive disturbances in the crystal lattice of the monocrystalline silicon. These mechanical stresses are apparently neutralised by the polycrystalline silicon layer. It has been found in particular that the polycrystalline silicon layer gives good satisfaction when using silicon nitride as a material masking against oxidation.

The thickness of the polycrystalline layer used is not critical, but in practice said thickness will rather not be chosen to be too large, preferably not exceeding 3000 A, so that it is not necessary to remove large layer thicknesses for exposing the underlying monocrystalline silicon. It has been found that the thickness of the layer can be very small without excessive disturbances occurring in the crystal lattice of the underlying monocrystalline silicon. In principle the layer may be chosen to be thinner as the polycrystalline silicon is more fine-grained. However, for practical purposes a larger thickness will usually be chosen, for example at least 300 A, which layer thickness can be provided in a reasonably uniform and reproducible manner over a comparatively large surface.

As is known, silicon layers provided epitaxially on a monocrystalline substrate are used in many semiconductor devices, in particular monolithic integrated circuits. The method according to the invention appears to be particularly suitable for the manufacture of similar types of semiconductor devices, for which purpose, according to a preferred embodiment, silicon is deposited epitaxially, at least partly, on a surface of a substrate body consisting at said surface at least mainly of a monocrystalline material, the layer of polycrystalline silicon being provided on the layer formed by said deposition. Methods of epitaxially depositing silicon and depositing polycrystalline silicon on a monocrystalline silicon substrate are known per se in the art. If desirable, the polycrystalline layer may be deposited in the same reactor as the epitaxial layer by depositing the silicon under different conditions. Polycrystalline silicon differs from monocrystalline silicon as regards doping and electrical properties. Inter alia, the diffusion coefficients under uniformly chosen conditions of the same impurity are in general much larger in the polycrystalline silicon than in the monocrystalline silicon. The presence of the polycrystalline layer in subsequent diffusion treatments might give rise to an uncontrollable lateral expansion of a diffusion zone to be provided. It is therefore to be preferred in general, after the oxidation to form the inset regions of silicon oxide, to eliminate the layer of the material masking against oxidation and the layer of polycrystalline silicon, at least partly. For this purpose, suitable etchants may be used in a manner known per se. According to a preferred embodiment it is also possible to effect the elimination of the layer of polycrystalline silicon at least partly by converting the polycrystalline silicon into silicon oxide. A masking layer on the monocrystalline silicon for use in localised diffusion processes or another manner of local doping according to conventional planar methods can thus be obtained without an extra step.

The invention furthermore relates to a semiconductor device, in particular a monolithic integrated circuit, manufactured by using the above-mentioned method according to the invention.

The invention will be described in detail with reference to the accompanying drawing, in which FIGS. 1 – 4 are detailed diagrammatic vertical cross-sectional views of stages in the known manufacture of an integrated circuit, in which oxide patterns inset in silicon are provided in known manner by oxidation with the use of a mask of a layer of silicon nitride on a layer of silicon oxide, and FIGS. 5 – 11 are detailed diagrammatic vertical cross-sectional views of successive stages in the manufacture of an integrated circuit having an oxide pattern inset in silicon according to an embodiment of the method according to the invention.

Referring now to FIG. 1, reference numeral 1 denotes a monocrystalline silicon body of p-type silicon having a resistivity of 3 ohm-cm, on which on one side semiconductor circuit elements are provided in islands which are isolated from each other. In the present case, n-type islands are isolated from each other by isolation zones which consist partly of insulating oxides inset in the semiconductor and parts of p-type regions below said inset oxide layers. In order to form said p-type zones, boron is locally diffused in the semiconductor substrate body in known manner to form the highly doped p-type zones 4 and 5. Furthermore, by the diffusion of a suitable donor in the semiconductor substrate body, for example arsenic or antimony, highly doped n-type regions are provided which form the n-type buried layers 3. An epitaxial layer 2 of n-type silicon is deposited in known manner on the semiconductor substrate body 1. The layer thickness may be, for example, 4 $\mu$u and the resistivity of epitaxially provided material may be 1.5 ohm-cm. An oxide layer, for example, 700 A thick, is then formed in known manner on the surface of the epitaxial layer. A silicon nitride layer is deposited in known manner on said oxide layer, which silicon nitride layer serves as a mask for the formation of insulating oxide layers locally inset in the semiconductor. Apertures 14, 15 and 16 are then provided in known manner in the said silicon nitride and silicon oxide layer at the area of the inset insulating oxide layers to be formed. If desired, the silicon may be oxidised at the area of said apertures. This oxidation is associated with an increase in volume, as a result of which the formed oxide will project considerably above the level of the epitaxial layer. In order to obtain afterwards a flatter structure, the grooves 17, 18 and 19 may first be etched in the silicon via the apertures 14, 15 and 16 down to a depth of, for example, 1 $\mu$. The resulting stage is shown in FIG. 1 in which as a result of the provision of the apertures 14, 15 and 16 the silicon oxide layer and the silicon nitride layer provided thereon are divided into the parts 6, 7, 8 and 9 of silicon oxide and the parts 10, 11, 12 and 13, respectively, of silicon nitride present thereon.

Figure 2:
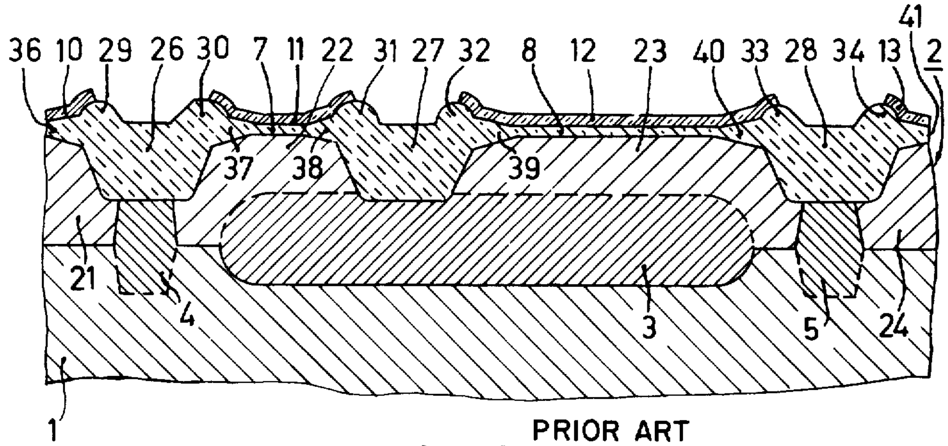
PRIOR ART Fig.2

The semiconductor body with the masking provided thereon is then exposed to an oxidising atmosphere to form the inset insulation layers at the area of the apertures 14, 15 and 16. As a result of the action of the oxidising atmosphere on the silicon via the grooves, the inset insulation layers 26, 27 and 28 of silicon oxide are formed with a thickness of approximately 2 $\mu$ (see FIG. 2). As a result of the increase in volume associated with the oxidation, the grooves 17, 18 and 19 are filled entirely, the formed oxide at that area reaching a level which is approximately equal to the height of the epitaxial layer 2 below the provided masking. Since the oxidation process also occurs laterally from the side walls of the grooves 17, 18 and 19, where the epitaxial layer is present in its original thickness, projecting ridges of silicon oxide 29, 30, 31, 32, 33 and 34 are formed due to the increase in volume associated with the oxidation. As is known, oxidation also takes place below the oxide layer parts 6, 7, 8 and 9, lateral diffusion of oxygen occurring via said layer parts from the edge thereof. As a result of the oxidation of the underlying silicon, said layer parts 6, 7, 8 and 9 obtain edge parts 36, 37 and 38, 39 and 40, and 41, respectively, gradually increasing in thickness. As is shown in FIG. 2, the cross-section of the oxide at the transition from the inset insulation layers 26, 27 and 28 to the oxide layers 6, 7, 8 and 9 more or less has the shape of a bird's head, the shape of the skull being obtained by the ridges 29, 30 and 31, 32 and 33, and 34, respectively, and the beak is formed by the thickened edge parts 36, 37 and 38, 39 and 40, and 41, respectively, of the oxide layers 6, 7, 8 and 9.

During said oxidation, and as a result of the heating used, further diffusion occurs from the buried p-type zones 4 and 5 and the buried n-type zones 3. As a result of this, the p-type zones 4 and 5 extend to the inset insulation layers 26 and 28, respectively, as a result of which the epitaxially provided n-type layer is divided into n-type islands 21, 22 – 23 and 24 which are isolated from each other. Although the parts 22 and 23 are laterally separated by the inset insulation layer 27, they are in low-ohmic contact with each other via the buried layer 3. The resulting stage is shown in FIG. 2.

Figure 3:
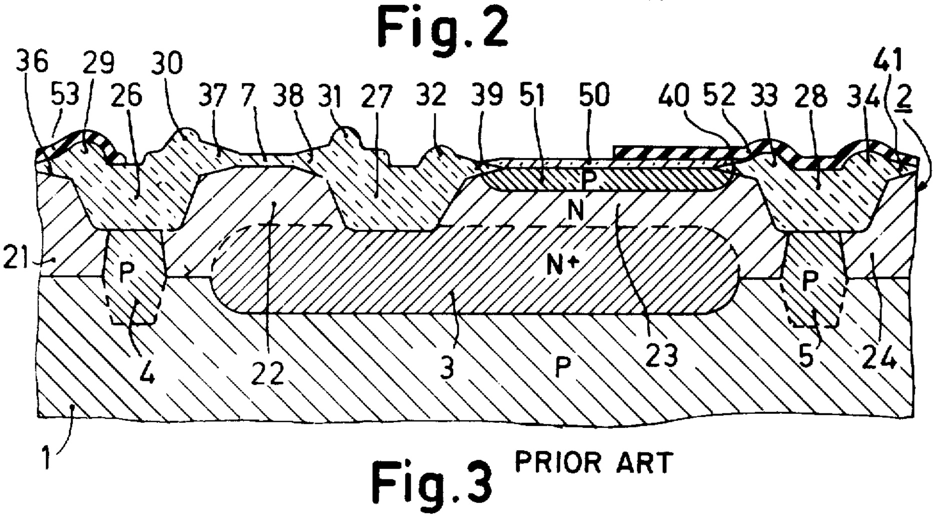
Fig.3 PRIOR ART
Figure 4:
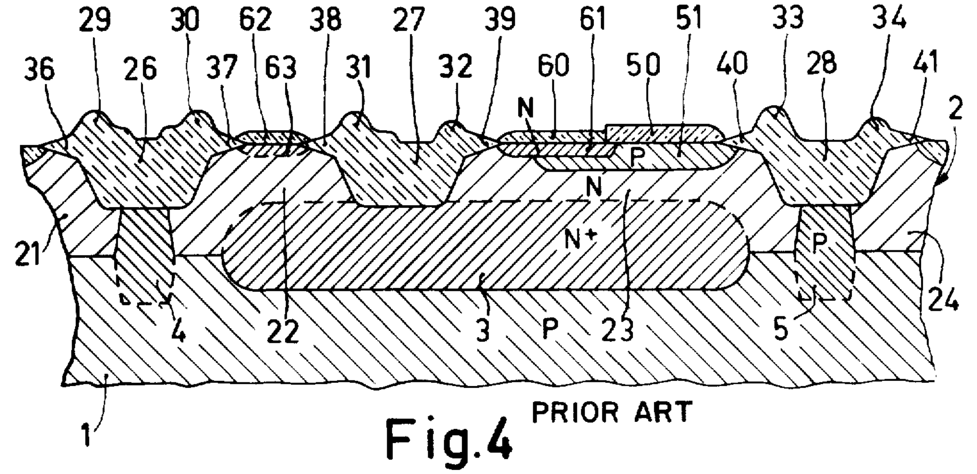
Fig.4 PRIOR ART

For the further processing, for example, to manufacture an n-p-n transistor in the region 23, doped zones must be formed in the resulting islands. For that purpose, the silicon nitride 10, 11, 12 and 13 is removed and, after a possible extra oxidation step to increase the thickness of the oxide layers 6, 7, 8 and 9, windows are provided by means of known photolithographic methods at the area of diffused zones to be formed. As is known, the use of isolation zones with insulation materials inset in the semiconductor provides the possibility of obtaining substantially plane p-n junctions which are bounded laterally by the inset insulation material. An additional advantage is that the dimensions of the zones to be diffused are determined by the location of the inset insulation layer so that the photolithographic methods to be used are little critical as regards the accuracy of the picture reproduction. In the present case, for example, the oxide layer 7 is maintained and the oxide layer 8 is removed by etching so as to diffuse a p-type base region in the n-type region 23. However, the presence of the widened edge parts, for example 39 and 40 of the oxide layer 8, should now be taken into account. The danger exists that in case the said edge parts 39 and 40 are insufficiently etched, they remain existing in a slightly reduced form and constitute as it were beak-like lateral spurs of the inset oxide layers 27 and 28, respectively (see FIG. 3). Upon manufacturing a transistor in the region 23, for example, a borate glass layer 50 is provided at low temperature and boron is diffused from said layer 50 in the region 23 to form a p-type base zone 51. The beak-like oxide parts 39, 40 present, the thickness of which gradually reduces to zero, could locally have a partial masking effect and for the rest a complete masking effect as a result of which the base zone 51 formed does not reach the actual side walls of the inset oxide layers 27 and 28. The p-n junction between the formed p-type base zone 51 and the remaining n-type region 23 will in that case terminate near the beak-like oxide parts 39, 40. For an emitter diffusion and a collector contact diffusion, windows should now be provided in which a photoresist masking 52, 53 can be used in known manner. A stage thus obtained is shown in FIG. 3. The provision of an emitter adjoining an inset oxide layer on one side may present difficulties in the present case. Upon etching away the silicon oxide layer 7 and the exposed part of the borate glass layer 50, the beak-like part 39 will also be shortened due to the etching treatment. As shown in FIG. 4 the result of this may be that during the emitter diffusion, for example with phosphorus, in which phosphate glass layers 60 and 62 and a highly doped n-type collector contact zone 63 are also formed, the emitter zone 61 on the side of the inset oxide layer 27 shortcircuits the remaining part of the region 23 of epitaxially provided n-type material meant as a collector region.

It is obvious from the above that when using a masking against oxidation, which masking consists of nitride on oxide, the formation of edge parts of the oxide layer below the nitride having varying thicknesses, such as the parts 39 and 40, should be taken into account. For example, the etching treatment to remove the oxide layer 8 may be continued sufficiently far in order that the beak-like parts 39 and 40 are also removed entirely. Such a prolonged etching, however, will also remove a part of the inset oxide; also it is difficult to visually check when the whole beak-like part 39, 40 will have disappeared.

It has been described with reference to FIGS. 1 to 4 how the possibility exists that difficulties can occur when the formation of beak-like edge parts of silicon oxide, for example as denoted by 39 and 40 in FIGS. 2 to 4, is not taken into account. When such effects are taken into account, it is of course also possible to restrict the emitter to a zone which is farther remote from the inset silicon oxide layer 27, the boundaries being accurately fixed by photo-lithographic methods. In that case, the use of inset oxide patterns is always more advantageous than the use of isolation zones which consist entirely of a semiconductor material of opposite conductivity type. For example, as a result of only a partial masking of the thinner parts of the beak-like oxide zones 39 and 40, the base-collector junction near the edge of the base region will be curved less sharply than when using a conventional oxide masking of uniform thickness with sharp window edge as is used in conventional planar methods. However, the use of inset insulation layers can be used to even greater advantage when the formation of beak-like edge zones of silicon oxide can be prevented.

An embodiment of the method according to the present invention will now be explained in greater detail with reference to FIGS. 5 to 11.

Starting material is a semiconductor body which is manufactured in a corresponding manner as was described with reference to FIG. 1. The semiconductor substrate body 101 used is a body of a monocrystalline p-type silicon having a resistivity of 3 ohm-cm. At the area of the isolation zones to be provided for an integrated circuit, highly doped p-type zones 104 and 105 are provided on one side of the semiconductor substrate body 101 by the local diffusion of boron. A suitable donor, for example arsenic, is locally diffused in the surface of the semiconductor-substrate body 101 to form n-type buried layers 103. An epitaxial layer 102 of n-type silicon having a resistivity of 1.5 ohm-cm. and a thickness of 4 $\mu$ is then provided in known manner.

In agreement with the idea underlying the present invention, a thin layer of polycrystalline silicon 80 is provided on the surface of the epitaxial layer 102. The thickness of said polycrystalline layer is approximately 0.1 $\mu$. The thickness of said polycrystalline layer is not critical but is generally chosen to be small as compared with the thickness of the inset oxide layers to be manufactured. The layer 80 may be provided in known manner, in the present case from silane in hydrogen at a temperature of approximately 700°C, while the epitaxial layer 102 can be deposited in the present case from the same gas mixture at a temperature of approximately 1050°C.

Figure 5:
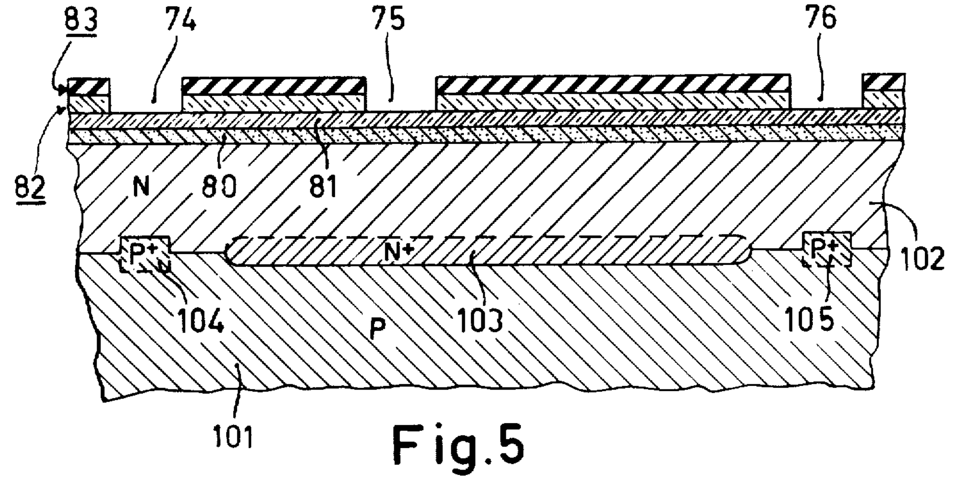

A silicon nitride layer 81, for example with a thickness between 0.1 and 0.2 $\mu$, is then provided on the polycrystalline layer 80. The provision can be carried out in known manner, for example, from silane and ammonia in hydrogen at approximately 1050°C. The resulting nitride layer will be used for masking the underlying silicon against oxidation upon forming a pattern of silicon oxide layers inset in the silicon by oxidation. For that purpose, apertures should be etched in the silicon nitride at the area of the inset oxide layers to be formed. For that purpose, a silicon oxide layer 82 of approximately the same thickness as the silicon nitride layer 81 is provided in known manner on the silicon nitride layer 81. In said layer 82, apertures 74, 75 and 76 are etched by means of a photo-lithographically provided pattern in a photoresist layer 83. The resulting stage is shown in FIG. 5. The silicon oxide layer 82 now serves as a masking for etching the silicon nitride layer 81. As an etchant is used, for example, in known manner orthophosphoric acid at a temperature of 150°–180°C. Apertures 114, 115 and 116 which divide the silicon nitride layer 81 into separate parts 110, 111, 112 and 113 are obtained in the silicon nitride layer. The remaining silicon oxide of the layer 82 may be removed, if desirable, for example with hydrofluoric acid.

Figure 6:
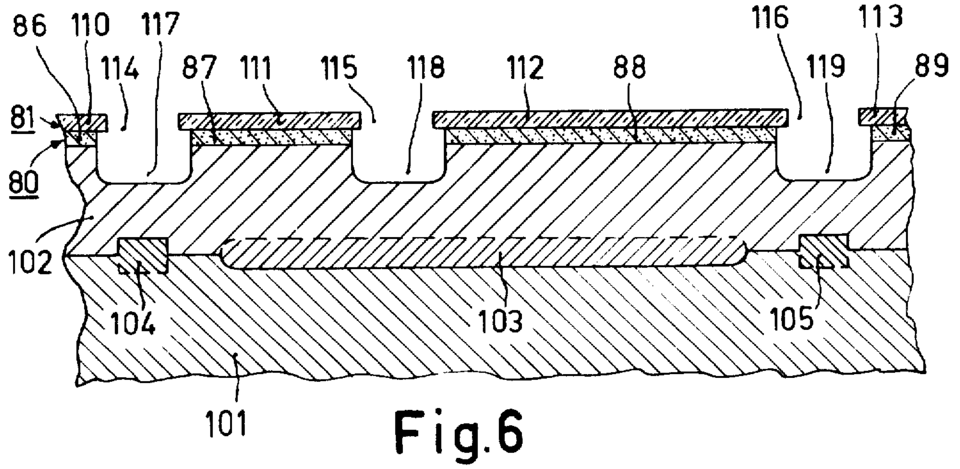

At the area of the said apertures, grooves 117, 118 and 119 are etched at the area of the said apertures, for example down to a depth of 1 $\mu$. The resulting stage is shown in FIG. 6. As a result of this etching treatment, the polycrystalline layer is divided into separate regions 86, 87, 88 and 89 present below the silicon nitride parts 110, 111, 112 and 113, respectively.

The resulting body is then subjected to a known oxidising treatment, for example by heating the body at a temperature of 1000°C for 16 hours in nitrogen saturated with water vapor at 95°C. By oxidation from the walls of the grooves 117, 118 and 119, inset oxide layers 126, 127 and 128 are formed, the grooves 117, 118 and 119 being filled and the upper side of the formed oxide layer becoming located approximately level with the epitaxial layer 102. In a corresponding manner as explained with reference to FIG. 2, ridges 129 and 130, 131 and 132, and 133 and 134, respectively, projecting above the remaining upper surface of the inset insulation layers are formed near the edges of the inset oxide layers 126, 127 and 128. During this treatment and possibly during subsequent thermal treatments, the buried p-type zones 104 and 105 extend by diffusion in the epitaxial layer 102 in such manner as to reach the lower side of the formed inset insulation layer 126 and 128, respectively. In a corresponding manner, the n-type buried layer may also extend up to the inset insulation layer 127. The high ohmic n-type material of the epitaxial layer is divided in this manner into regions 121, 122-123 and 124. The n-type regions 122 and 123 are connected together in a readily conducting manner by means of the n-type buried layer 103, underneath, the inset oxide layer 127, and together constitute an island which is laterally isolated from the juxtaposed n-type regions 121 and 124 by isolation zones consisting of the inset oxide layers 126 of insulating silicon oxide and the buried p-type zone 104, and the inset insulation layer 128 of insulating silicon oxide and the buried p-type zone 105, respectively.

Figure 7:
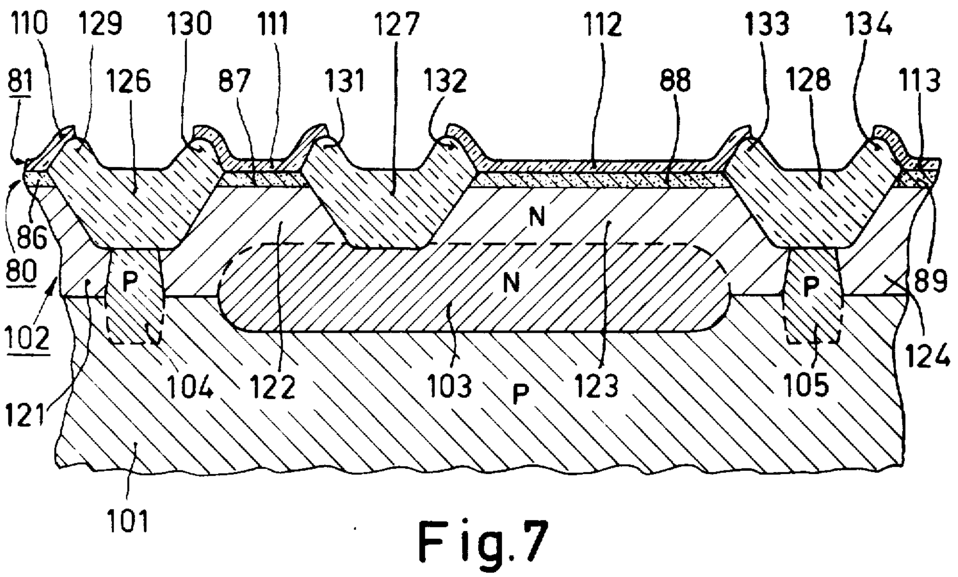

Local, excessive formation of dislocations in the underlying monocrystalline silicon of the epitaxial layer, as was found in the above-mentioned case in which the masking of silicon nitride was directly provided on the monocrystalline silicon, was not established. It is found in this respect that the polycrystalline silicon layer 80 has the same favourable effect as the oxide layers 6, 7, 8 and 9 in the known method of forming inset insulation layers, as was described above with reference to FIGS. 1 and 2, namely that the intermediate layer neutralises the mechanical stresses between the monocrystalline silicon and the silicon nitride for the greater part. It has furthermore been found that the extent of expansion of the oxidation process in silicon, when comparing the monocrystalline silicon to the polycrystalline silicon, shows substantially no mutual difference. It has been found that the formation of beak-like edge parts 36, 37, 38, 39, 40 and 41 projecting laterally from the inset oxide layer and described with reference to FIGS. 1 to 4 does not occur when using the polycrystalline silicon layer parts 86, 87, 88 and 89 between the silicon nitride of the layer parts 110, 111, 112 and 113, respectively, and the monocrystalline parts 121, 122, 123 and 124, respectively, of the epitaxial layer. The resulting stage is shown in FIG. 7. The silicon nitride masking used during the oxidation is now removed, for example in the above-described known manner with orthophosphoric acid. The polycrystalline silicon 86, 87, 88 and 89 may then also be removed, but in the present case in which the polycrystalline silicon layer is only very thin, this removal step may also be omitted. Actually, in the further process steps for manufacturing semiconductor circuit elements by planar techniques conventional silicon oxide maskings are used which are formed at the surface by oxidation of silicon. The thickness of such masking layers, although smaller than the thickness of the applied inset oxide layers, normally is sufficient to guarantee the polycrystalline silicon of the remaining layer parts 86, 87, 88 and 89 may be entirely oxidised. The body with the now exposed zones 86, 87, 88 and 89 of polycrystalline silicon is therefore subjected to a conventional oxidising treatment, for example, by heating in a water vapor-containing atmosphere at a temperature of 1000°C for 20 minutes. All the polycrystalline silicon and some silicon of the underlying monocrystalline epitaxially provided material is converted, in which silicon oxide layer parts 96, 97, 98 and 99 are formed on the silicon and laterally adjoin the inset oxide layers 126, 127 and 128 of a much larger thickness.

Figure 8:
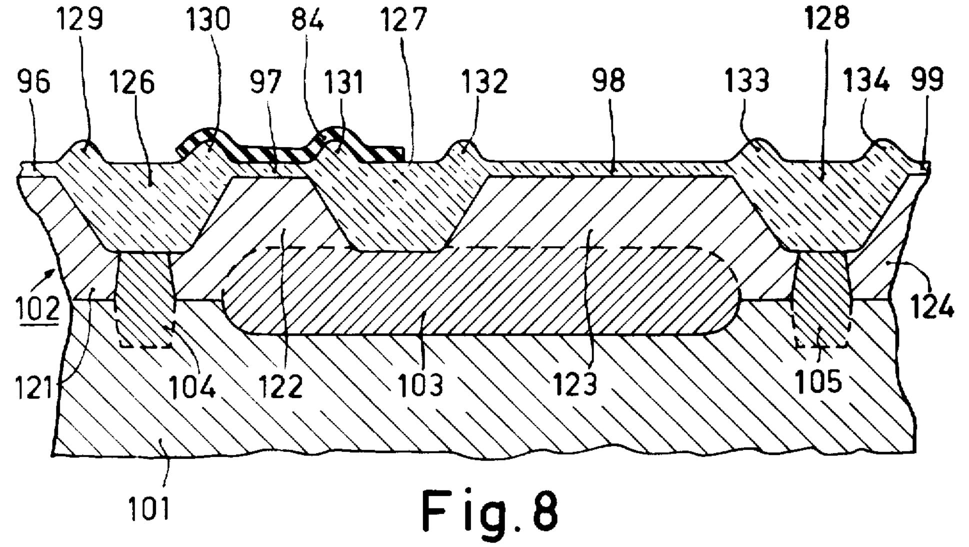

For the construction of an n-p-n transistor in the n-type region 123 a base diffusion must be carried out locally by the local diffusion of boron. The region 122 is destined for connecting the collector via the buried layer 103. During the base diffusion, the region 122 should be masked. To this end a photoresist pattern 84 is provided by means of known photolithographic methods. The resulting stage is shown in FIG. 8. In the usual manner, an etching treatment is then carried out and that in such manner that the thin oxide layer parts 96, 98 and 99 are just removed and not too much material of the exposed parts of the inset oxide layer 126, 127 and 128 is etched away. Since the oxide layer parts 96, 98 and 99 have the same thicknesses everywhere, nothing projecting laterally from the inset oxide layers in the form of a beak remains behind (see FIG.9). A boron diffusion process is then carried out in known manner, in which layers of borate glass 70, 150 and 90, respectively, are formed on the regions 121, 123 and 124 of the epitaxial layer 102 and p-type zones 71, 151 and 91 are obtained by diffusion of boron in the silicon. Since from the surface of the silicon the transition between the silicon and the inset oxide layers has a comparatively steep variation, the diffusion of boron in the region 123 can occur approximately uniformly throughout the width of the front in the direction of the depth, so that the formed p-type zone 151 forms a p-n junction with the remaining high ohmic n-type material of the part 123 of the epitaxial layer, said junction extending substantially horizontally and adjoining the inset oxide layers 127, 128. Close to said inset oxide layers, the p-n layers, the p-n junction may be slightly bent upwards in that the silicon oxide of the inset insulation layers tends to absorb boron. Nevertheless, the p-n junction is flatter than in the case shown in FIG. 3 in which the beak-like projecting silicon oxide parts 39 and 40 inhibit the vertical boron diffusion at the edges of the region 23.

Figure 9:
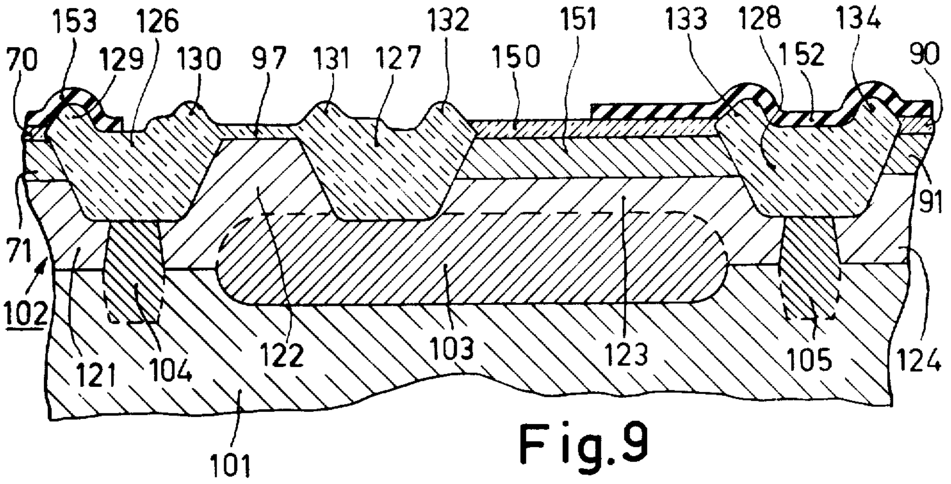
Figure 10:
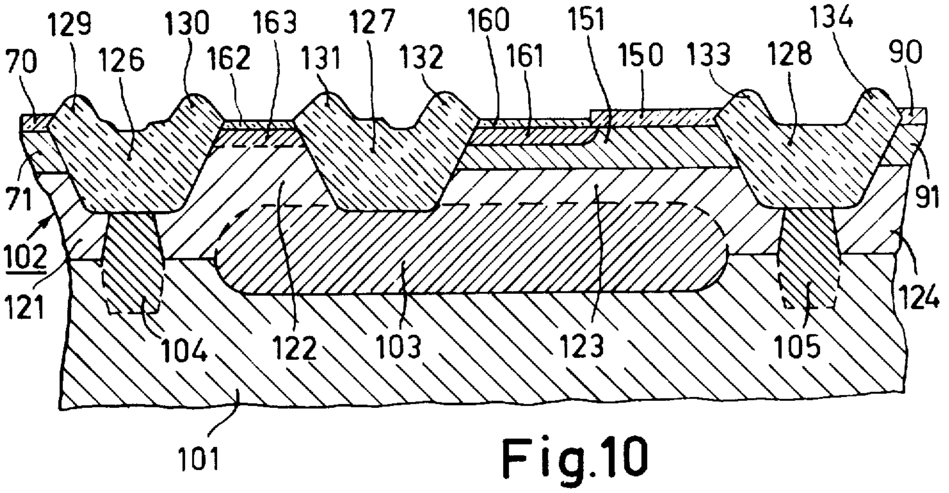

An emitter should now be provided locally in the base region 151 by donor diffusion. A possibility of providing a contact to the base region should also be maintained. During the emitter diffusion, an n-type region of low resistivity can also be provided on the surface of the region 122 so as to connect a collector contact of low contact resistance with it. For that purpose, a photoresist masking 152, 153 is provided, again in known manner, photolithographically, the thin oxide layer 97 and a part of the borate glass layer 150 remaining uncovered. The resulting stage is shown in FIG. 9. In the usual manner the exposed thin oxide layer parts are removed by means of a short lasting etching treatment, without an excessive quantity of any exposed material of the inset oxide layers being dissolved. Phosphorus is now diffused in known manner, phosphate glass layers 162 and 160, respectively, being formed at the area where the layer 97 and the non-masked part of the layer 150 have been removed during the etching treatment. Highly doped n-type regions 163 and 161, respectively, have been formed below said phosphate glass layer, the region 161 serving as emitter zone laterally adjoining the inset insulation layer 127. Since also at the boundary with the inset oxide layer 127 the p-n junction between the p-type zone 151 and the remaining n-type material of the part 123 is sufficiently far remote from the silicon surface, such an emitter zone 161 adjoining the inset oxide layer 127 may be provided without a short-circuiting connection being formed between said emitter zone 161 and the collector 123. The resulting stage is shown in FIG. 10.

Figure 11:
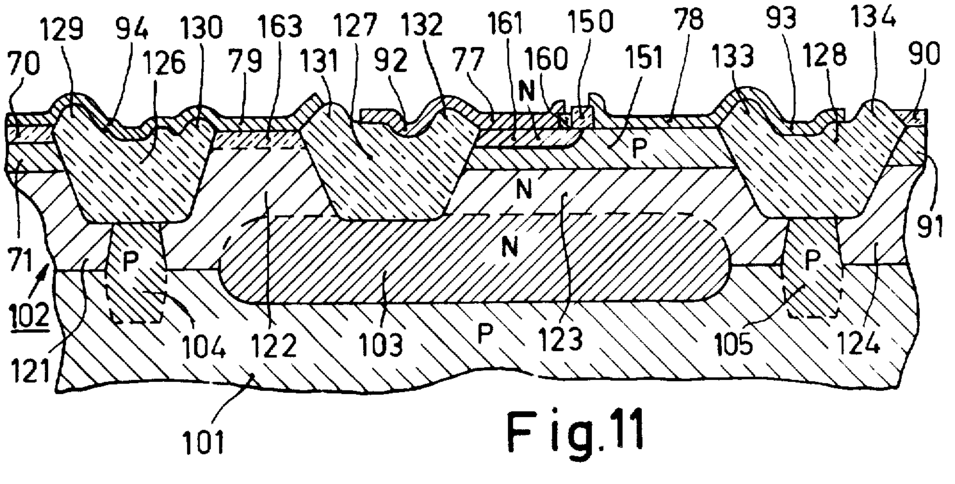

For providing contacts, contact windows are now provided in the usual manner by means of known photographic methods. Windows which are separated from each other are provided in the layer 160 and in the layer 150, while the phosphate glass layer 162 is removed entirely. By providing a metal contact layer, for example by vapor depositing aluminum, and etching the provided metal layer with the use of a photolithographically provided masking, contacts and adjoining conductive connection strips may be provided in the usual manner, for example, an emitter contact 77 with an adjoining connection conductor 92 present on the inset oxide layer, a base contact 78 with an adjoining connection strip 93 present on the inset oxide layer 128, and a collector contact 79 with an adjoining connection conductor 94 extending over the inset oxide layer 126. A detail of the integrated circuit obtained in this manner is shown in FIG. 11.

It has been found that in integrated circuits thus manufactured a frequent occurrence of p-n junctions with abnormally high leakage currents, as were found after using a silicon nitride layer provided directly on monocrystalline silicon, does not occur.

The occurrence of parts of inset oxide layers projecting laterally in a beak-like manner when using a silicon oxide layer below a nitride layer does not depend upon the fact that preceding the oxidation a groove may be etched in the monocrystalline silicon. Actually, it is known that the oxidation process can also be used without previously etching such a groove. However, in that case also the edge of the oxide layer below the masking layer of silicon nitride is exposed to the oxidising atmosphere. The advantages of the choice of a polycrystalline silicon layer between the nitride layer and the monocrystalline silicon over the use of such an intermediate layer of silicon oxide, therefore also applies to the case in which no groove is provided at the area of the inset silicon oxide layer to be manufactured.

Furthermore, the advantages of the method according to the invention are not restricted to integrated circuits having transistors. In general, steep junctions between the semiconductor islands and inset insulation layers of isolation zones are favorable for the reproducibility in series manufacture of all kinds of planar semiconductor devices, in particular for use in integrated circuits using planar and photographic processes.

Since in accordance with the teachings of the present invention the polycrystalline silicon layer prevents the occurence of beak-like laterally projecting oxide parts, and also neutralises the results of mechanical stresses between the silicon and the silicon nitride layer, the present invention offers the possibility of further effectively employing the advantages resulting from the use of inset oxide layers.

What is claimed is:

1. A method of manufacturing a semiconductor device comprising providing a semiconductor body comprised mainly of a monocrystalline silicon portion, providing on the surface of the semiconductor body a layer of polycrystalline silicon material, providing on the polycrystalline silicon layer a layer of material capable of masking silicon against oxidation, patterning at least the oxidation masking layer to form openings at the areas where it is desired to inset an oxide, and thereafter oxidizing said body at the said openings until an inset oxide is formed that penetrates down into the monocrystalline silicon portion to a depth substantially below that of adjacent polycrystalline silicon layer portions.

2. A method as claimed in claim 1, wherein the polycrystalline silicon layer is deposited directly on the surface of the monocrystalline silicon portion.

3. A method as claimed in claim 2, wherein the patterning forms openings also in the polycrystalline layer such that the openings extend down to the monocrystalline silicon.

4. A method as claimed in claim 2, wherein the masking material consists of silicon nitride.

5. A method as claimed in claim 2, wherein the layer of polycrystalline silicon has a thickness of at most 3000 A.

6. A method as claimed in claim 5 wherein the layer of polycrystalline silicon has a thickness of at least 300 A.

7. A method as claimed in claim 2 wherein silicon is deposited epitaxially, at least partly, on a surface of a substrate body consisting at said surface at least mainly of monocrystalline material, the layer of polycrystalline silicon being provided on the said layer formed by said epitaxial deposition.

8. A method as set forth in claim 7, wherein the oxidation is continued until the inset oxide penetrates through the epitaxial deposit into contact with semiconductive material of the same type as that of the substrate.

9. A method as claimed in claim 2, wherein after the oxidation to form the inset regions of silicon oxide, the layer of the material masking against oxidation and the layer of polycrystalline silicon are eliminated at least partly.

10. A method as claimed in claim 9, wherein the elimination of the layer of polycrystalline silicon, at least partly, is carried out by converting the polycrystalline silicon into silicon oxide.

11. A method as claimed in claim 10, wherein the layer obtained from the oxidation of the polycrystalline silicon is used for masking during a subsequent step of local doping of the monocrystalline silicon.

* * * * *